(12) United States Patent
Shiratake et al.

(10) Patent No.: US 7,053,696 B2
(45) Date of Patent: May 30, 2006

(54) SEMICONDUCTOR DEVICE WITH RESISTOR ELEMENT

(75) Inventors: Shinichiro Shiratake, Yokohama (JP); Kohei Oikawa, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 10/685,490

(22) Filed: Oct. 16, 2003

(65) Prior Publication Data
US 2004/0129980 A1    Jul. 8, 2004

(30) Foreign Application Priority Data
Oct. 17, 2002   (JP) .............................. 2002-302759

(51) Int. Cl.
  *G05F 1/10* (2006.01)
  *G05F 3/02* (2006.01)
(52) U.S. Cl. ...................... 327/543; 327/541
(58) Field of Classification Search ................ 327/530, 327/538, 540–541, 543, 308, 334
See application file for complete search history.

(56) References Cited

U.S. PATENT DOCUMENTS

| 4,158,786 | A | * | 6/1979 | Hirasawa ................... 327/543 |
| 4,529,890 | A | * | 7/1985 | Kobayashi et al. ......... 327/108 |
| 5,179,539 | A | | 1/1993 | Horiguchi et al. .......... 365/226 |
| 5,689,460 | A | * | 11/1997 | Ooishi ................... 365/189.07 |
| 5,929,696 | A | * | 7/1999 | Lim et al. ................... 327/540 |
| 6,686,789 | B1 | * | 2/2004 | Lopata et al. .............. 327/334 |

FOREIGN PATENT DOCUMENTS

JP   5-304448   11/1993
JP   6-326587   11/1994

OTHER PUBLICATIONS

U.S. Appl. No. 10/233,529, filed Sep. 4, 2002, Oikawa et al.

* cited by examiner

*Primary Examiner*—Quan Tra
(74) *Attorney, Agent, or Firm*—Oblon, Spivak, McClelland, Maier & Neustadt, P.C.

(57) ABSTRACT

A semiconductor device includes first, second, third and fourth resistor elements. The first to fourth resistor elements have first ends commonly connected to a first node, and operate in one of first and second operation modes which are switchable. The first and second resistor elements have second ends connected to a second node and a third node, respectively. The third and fourth resistor elements have second ends connected to a fourth node and a fifth node via a first switch and a second switch, respectively. The first and second switches are opened in the first operation mode, and are closed in the second operation mode.

15 Claims, 8 Drawing Sheets

SEMICONDUCTOR DEVICE WITH RESISTOR ELEMENT

CROSS-REFERENCE TO RELATED APPLICATIONS

This application is based upon and claims the benefit of priority from the prior Japanese Patent Application No. 2002-302759, filed Oct. 17, 2002, the entire contents of which are incorporated herein by reference.

BACKGROUND OF THE INVENTION

1. Field of the Invention

The present invention relates to a semiconductor device configured to have, for example, a resistor element with parasitic capacitance as a structural component.

2. Description of the Related Art

In ordinary techniques, a resistor element is used as a voltage-division element or one of CR time constant elements in a power supply circuit for producing a constant potential or in a delay circuit for providing a signal delay within a semiconductor device. A resistor element has a resistance of a predetermined value between two nodes. In many cases, a resistor element of several-ten Ω to several-mega Ω is used. However, in an actual fabrication process of a semiconductor device, a resistor element with an ideal resistance component alone cannot be manufactured and a parasitic capacitance is inevitably added.

For example, in a case where an N-type impurity diffusion layer region is formed on a P-type semiconductor substrate and it is used as a resistor element, a parasitic capacitance is added to a node for connection with the resistor element due to a PN junction occurring between the P-type substrate and the N-type diffusion layer. Such a parasitic capacitance occurring in the resistor element fabrication process may lead to an unstable circuit operation, as described below.

Figure 1:
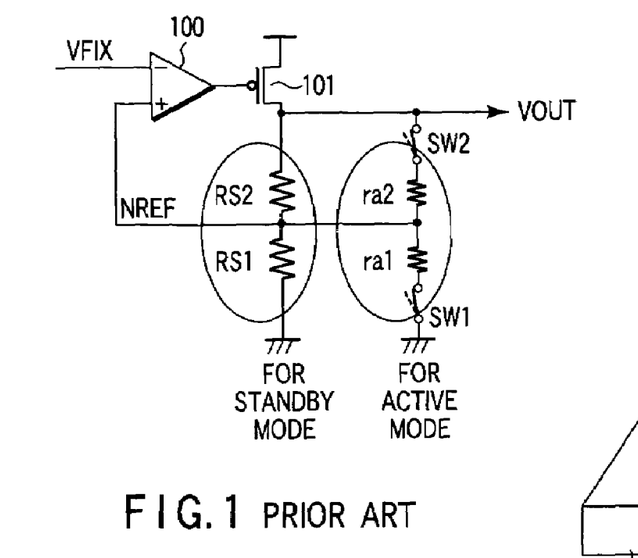
FIG. 1 is a circuit diagram showing a prior-art semiconductor device having resistor elements.

FIG. 1 is a circuit diagram of a conventional semiconductor device using resistor elements formed on a semiconductor substrate. The semiconductor device shown in FIG. 1 is a semiconductor device that is used by effecting switching between two modes, an active mode and a standby mode (i.e. inactive mode).

In FIG. 1, in the active mode, switches SW1 and SW2 are closed, and an output voltage VOUT is resistor-divided by two resistor elements ra1 and rb1 each having a low resistance value. The divided voltage is supplied as a reference potential to a reference node NREF. The reference potential is compared with a fixed potential VFIX by a comparison circuit 100. A comparison output is delivered to the gate of a PMOS transistor 101 that functions as an output adjusting element. Thereby, an output voltage VOUT corresponding to the active mode is produced.

If the output voltage VOUT varies due to some cause, e.g. a variation in load, an influence of the variation appears at the reference node NREF as a reference potential variation and is fed back to the comparison circuit 100. In this way, a control to keep the output voltage VOUT constant is performed.

When the semiconductor device is in the active mode, as described above, the output voltage VOUT is controlled by the low-resistance resistor elements ra1 and ra2. When the semiconductor device is in the standby mode, the switches SW1 and SW2 are opened and the standby mode is set in a low power consumption state using resistor elements RS1 and RS2. However, when the active mode transits to the standby mode, as shown in FIG. 1, the following problem occurs due to parasitic capacitance added to each resistor element. The problem is explained referring to FIG. 2.

Figure 2:
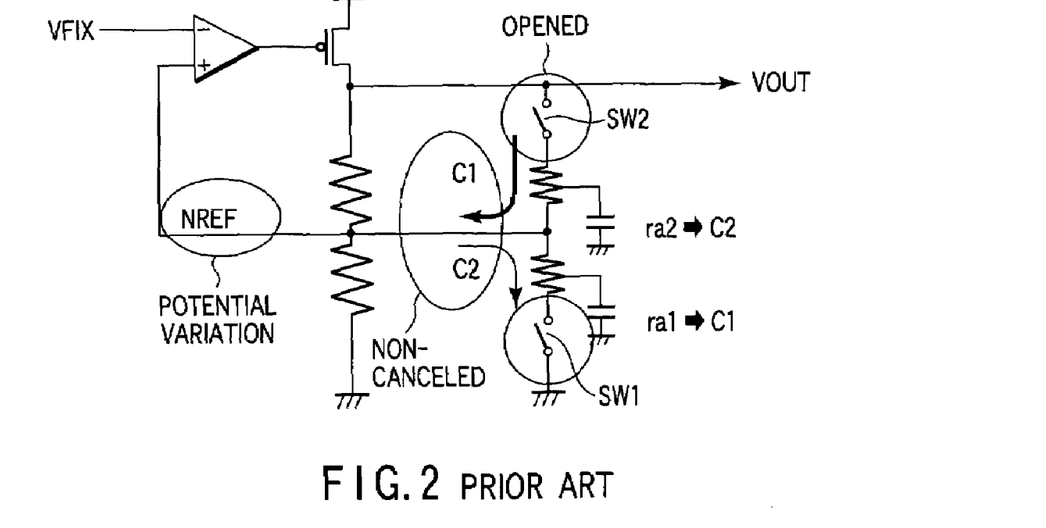
FIG. 2 is a view for explaining an adverse effect of parasitic capacitance on the prior-art semiconductor device with the resistor element shown in FIG. 1.

FIG. 2 is an equivalent circuit diagram for explaining an adverse effect on the circuit operation due to a parasitic capacitance in a case where there is a difference (high/low relationship) in resistance value between the low-resistance resistor elements ra1 and ra2 in the circuit shown in FIG. 1 and accordingly there is a difference in parasitic capacitance.

When the semiconductor device is switched from the active state to the standby state, as shown in FIG. 2, the switches SW1 and SW2 are opened and no current flows through the low-resistance resistor elements ra1 and ra2. However, since there are parasitic capacitances in the resistor elements ra1 and ra2, an accumulated charge of the parasitic capacitances may, in some cases, be discharged through the resistor element RS1, etc.

For example, when the resistance value of the resistor element ra2 is higher than that of the resistor element ra1, the diffusion area of the resistor element ra2 is accordingly larger in usual cases, and thus the parasitic capacitance of the resistor element ra2 is higher than that of the resistor element ra1. Hence, a charge C1, which flows from the parasitic capacitance of the resistor element ra2 to the high-resistance resistor element RS1 via a node connected to the reference node NREF, is greater than a charge C2 flowing from the reference node NREF side toward the parasitic capacitance of the low-resistance resistor element ra1. Both charges C1 and C2 do not cancel each other. As a result, the potential at the reference node NREF rises, and the control of the output voltage VOUT in the standby mode becomes unstable.

Figure 3:
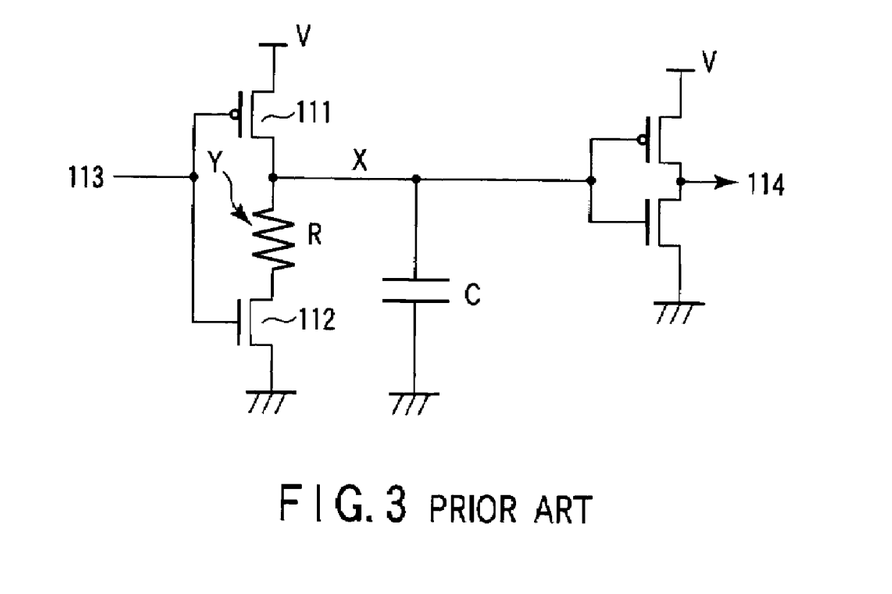
FIG. 3 is a circuit diagram of a prior-art semiconductor device having a resistor element.

FIG. 3 is a circuit diagram of another conventional semiconductor device using a resistor element with a parasitic capacitance formed on a semiconductor substrate. The operation of the circuit shown in FIG. 3 is described referring to FIG. 4.

In FIG. 3, if the potential at an input terminal 113 rises from "L" (low level) to "H" (high level), a transistor 112 is turned on and a charge in a capacitor C connected to a node X is discharged via a resistor element R and the transistor 112. A time t needed for the discharge is approximately equal to a time constant (t~RC) obtained by multiplying a resistance value R of the resistor element R by a capacitance value C of the capacitor C. A delay is intentionally added to the time for transmission of a signal from the input terminal 113 to an output terminal 114, by making use of the RC time constant.

When the potential at the input terminal 113 falls back to "L", a transistor 111 is turned on and the potential at the node X is charged to "H" by a power supply voltage V. However, since a parasitic capacitance is added to the resistor element R, a predetermined time is needed to completely charge the entire resistor element R to the "H" level. The time needed for charging the resistor element R is approximately RCp, where Cp is a parasitic capacitance of the resistor element R and R is the resistance value of the resistor element R.

Figure 4:
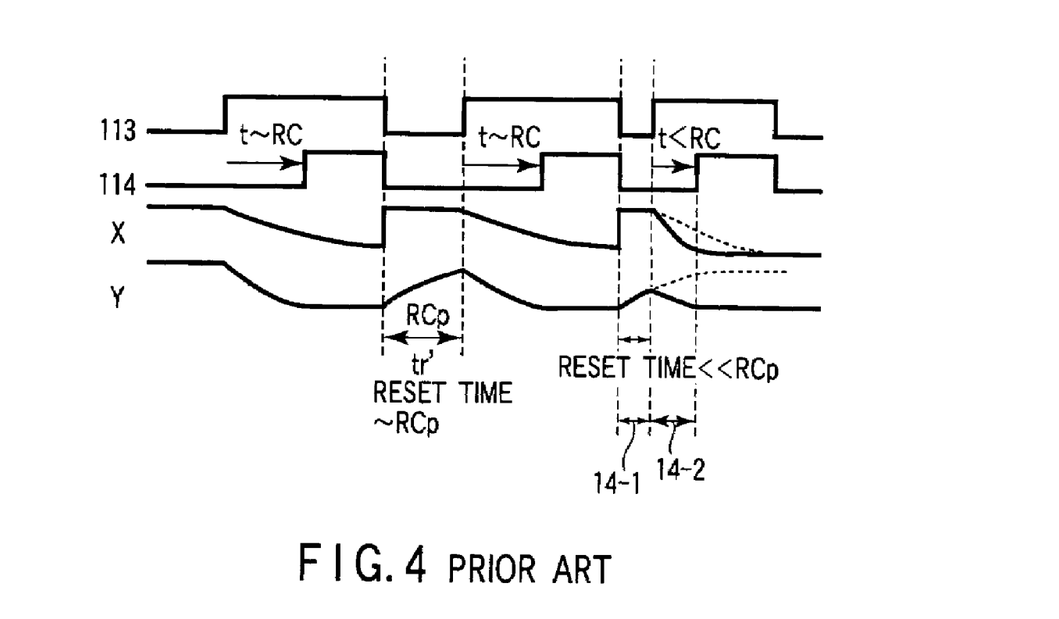
FIG. 4 is an operational waveform chart relating to the prior-art semiconductor device with the resistor element shown in FIG. 3.

In the circuit of FIG. 3, if a time (reset time) in which the input to the input terminal 113 is "L", that is, the potential at node X is "H", is much shorter than the time constant RCp (reset time<<RCp), as shown in FIG. 4, the parasitic capacitance in the resistor element R is not fully charged to "H" (time period 14-1 in FIG. 4). As a result, the time period needed for the discharge of the charge accumulated at the node X after the input potential falls back to "L" becomes shorter than the time period in the case where the resistor element R is fully charged (time 14-2 in FIG. 4).

Consequently, depending on the length of time in which the input IN is held at "L", a delay time between the input and the output will vary. In particular, if the time in which the input IN is held at "L" is short, the delay time would become short.

BRIEF SUMMARY OF THE INVENTION

A semiconductor device according to an aspect of the present invention comprises first, second, third and fourth resistor elements, the first to fourth resistor elements having first ends commonly connected to a first node, and operating in one of first and second operation modes which are switchable, wherein the first and second resistor elements have second ends connected to a second node and a third node, respectively, the third and fourth resistor elements have second ends connected to a fourth node and a fifth node via a first switch and a second switch, respectively, the first and second switches are opened in the first operation mode, and the first and second switches are closed in the second operation mode.

A semiconductor device according to another aspect of the invention comprises: an output adjusting circuit which has a first input terminal supplied with a fixed potential, a second input terminal supplied with a reference potential from a reference node, and an output terminal, and is operable in a standby mode and in an active mode; and an output setting unit including a first output setting circuit connected between the reference node and a reference potential terminal, and a second output setting circuit connected between the output terminal and the reference node, wherein the first output setting circuit includes at least first and second resistor elements connected in series via a first voltage-division node between the reference node and the reference potential terminal in the standby mode, and at least third and fourth resistor elements connected in series via a second voltage-division node connected to the first voltage-division node between the reference node and the reference potential terminal in the active mode, and a ratio in resistance value between the first resistor element and the second resistor element is substantially equal to a ratio in resistance value between the third resistor element and the fourth resistor element, and the second output setting circuit includes at least fifth and sixth resistor elements connected in series via a third voltage-division node between the output terminal and the reference node in the standby mode, and at least seventh and eighth resistor elements connected in series via a fourth voltage-division node connected to the third voltage-division node between the output terminal and the reference node in the active mode, and a ratio in resistance value between the fifth resistor element and the sixth resistor element is substantially equal to a ratio in resistance value between the seventh resistor element and the eighth resistor element A semiconductor device according to still another aspect of the present invention comprises: a first power supply terminal and a second power supply terminal; a first charging circuit having one end connected to the first power supply terminal and the other end connected to one end of a resistor element; a discharging circuit having one end connected to the other end of the resistor element, and the other end connected to the second power supply terminal; a capacitor having one end connected to the one end of the resistor element, and the other end connected to the second power supply terminal; and a second charging circuit having one end connected to the first power supply terminal, and the other end connected to the other end of the resistor element.

DETAILED DESCRIPTION OF THE INVENTION

Embodiments of the present invention will now be described with reference to the accompanying drawings. In the descriptions below, common parts are denoted by like reference numerals throughout the drawings.

First Embodiment

Figure 5A:
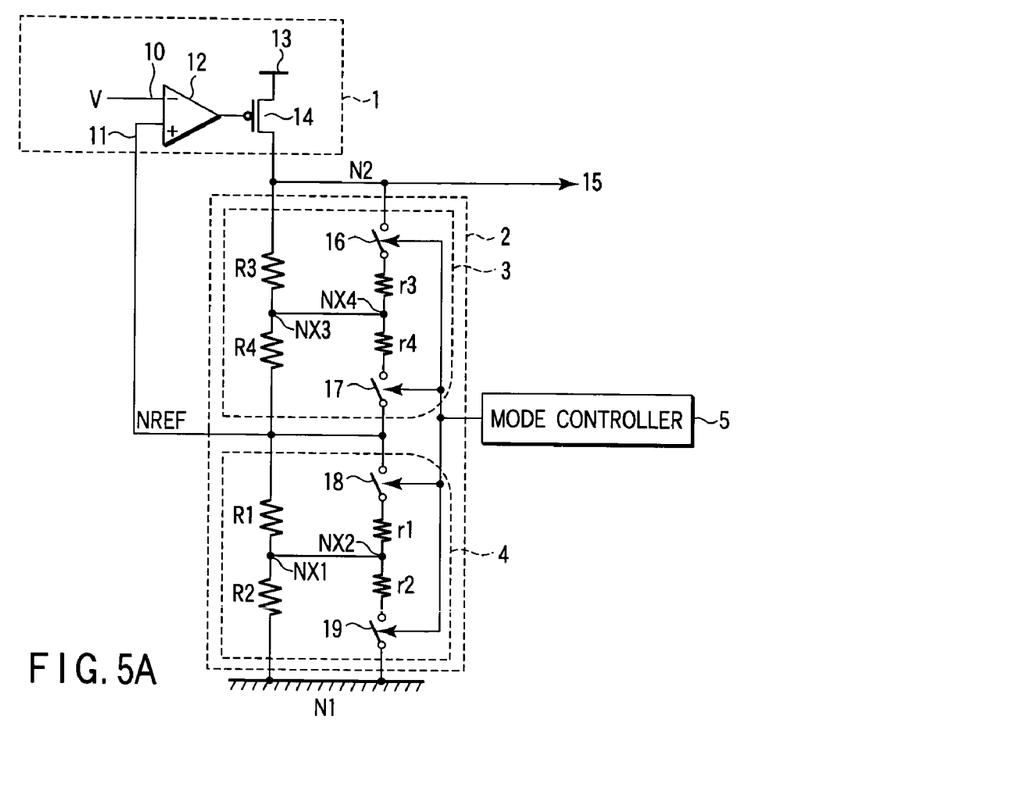
FIG. 5A is a circuit diagram of a semiconductor device with resistor elements, according to a first embodiment of the present invention.

FIG. 5A is a circuit diagram of a semiconductor device with resistor elements formed on a semiconductor substrate, according to a first embodiment of the present invention.

In the semiconductor device of the first embodiment, one of an active mode and a standby mode in an output setting unit 2 is selectively set by an output from a mode controller 5. A feedback potential corresponding to the set mode is fed from a reference node NREF to an output adjusting circuit 1. An output corresponding to the set mode is delivered to an output terminal 15.

The output adjusting circuit 1 comprises a comparison circuit 12 that compares a reference potential fed back from the reference node NREF to the input terminal 11 with a constant potential (const. V), and a control element 14 that controls an output current to be supplied to the output terminal 15 in accordance with the output from the comparison circuit 12.

The control element 14 is a PMOS transistor 14 having a gate connected to an output of the comparison circuit 12, a source connected to a power supply terminal 13, and a drain connected to a node N2 that is connected to the output terminal 15 and output setting unit 2.

The output setting unit 2 comprises a first output setting circuit 4 connected between the reference node NREF and a reference potential terminal N1 (a ground potential in this example) and a second output setting circuit 3 connected between the output terminal 15 and the reference node NREF.

The first output setting circuit 4 includes a first resistor element R1 and a second resistor element R2, which are connected in series in the standby mode via a first voltage-division node NX1 between the reference node NREF and the reference potential terminal N1, and a third resistor element r1 and a fourth resistor element r2, which are connected in series in the active mode via a second voltage-division node NX2 connected to the first voltage-division node NX1 between the reference node NREF and the reference potential terminal N1. The ratio between the resistance values of the first and second resistor elements R1 and R2 is set to be substantially equal to the ratio between the resistance values of the third and fourth resistor elements r1 and r2 (r1/r2=R1/R2).

The second output setting circuit 3 includes a fifth resistor element R3 and a sixth resistor element R4, which are connected in series in the standby mode via a third voltage-division node NX3 between the output terminal 15 and the reference node NREF, and a seventh resistor element r3 and an eighth resistor element r4, which are connected in series in the active mode via a fourth voltage-division node NX4 connected to the third voltage-division node NX3 between the output terminal 15 and the reference node NREF. The ratio between the resistance values of the fifth and sixth resistor elements R3 and R4 is set to be substantially equal to the ratio between the resistance values of the seventh and eighth resistor elements r3 and r4 (r3/r4=R3/R4).

The third resistor element r1, fourth resistor element r2, seventh resistor element r3 and eighth resistor element r4 are connected in series between the output terminal 15 and the reference potential terminal N1 via switches 16, 17, 18 and 19 which are turned on in the active mode and turned off in the standby mode by an output from the mode controller 5.

The first resistor element R1, second resistor element R2, fifth resistor element R3 and sixth resistor element R4 have higher resistance values than the third resistor element r1, fourth resistor element r2, seventh resistor element r3 and eighth resistor element r4, respectively.

However, preferably, the resistance values of the first resistor element R1 and second resistor element R2 are set to be substantially equal to each other, and the resistance values of the fifth resistor element R3 and sixth resistor element R4 are set to be substantially equal to each other (R1~R2, R3~R4). In addition, preferably, the resistance values of the third resistor element r1 and fourth resistor element r2 are set to be substantially equal to each other, and the seventh resistor element r3 and eighth resistor element r4 are set to be substantially equal to each other (r1~r2, r3~r4).

The switches 16 to 19 shown in FIG. 5A are connected to the mode controller 5. The mode controller 5 outputs a mode designation signal to turn on the switches 16 to 19 in the active mode and to turn off the switches 16 to 19 in the standby mode. Thus, the mode controller 5 opens/closes the switches 16 to 19 at the same time.

Figure 5B:
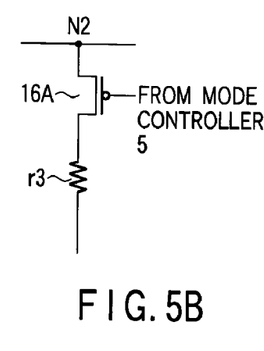
FIG. 5B to FIG. 5D are circuit diagrams showing examples of a switch used in the semiconductor device shown in FIG. 5A.
Figures 5C, 5D:
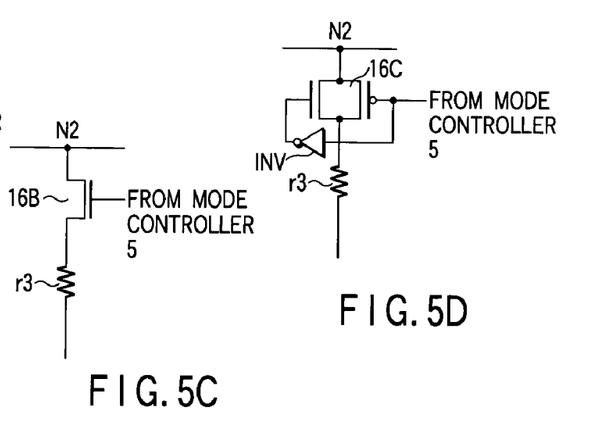

FIG. 5B, FIG. 5C and FIG. 5D show switches 16A, 16B and 16C, which are three examples of the switch 16 connected between the node N2 and resistor element r3. The other switches 17 to 19 may be configured similarly.

The switch 16A shown in FIG. 5B is a PMOS transistor having a gate connected to the output of the mode controller 5, a source connected to the node N2, and a drain connected to one end of the resistor element r3.

The switch 16B shown in FIG. 5C is an NMOS transistor having a gate connected to the output of the mode controller 5, a source connected to one end of the resistor element r3, and a drain connected to the node N2.

The switch 16C shown in FIG. 5D is configured such that a PMOS transistor having a gate connected to the output of the mode controller 5, a source connected to the node N2, and a drain connected to one end of the resistor element r3, and an NMOS transistor having a gate connected to the inversion of the output of the mode controller 5, a source connected to the said one end of the resistor element r3, and a drain connected to the node N2, are connected in parallel between the node N2 and the said one end of the resistor element r3. In addition, an inverter INV is connected between the gate of the PMOS transistor and the gate of the NMOS transistor. For example, when an L-level switch control signal is supplied from the mode controller 5, an H-level output is produced from the inverter INV. Thus, both the PMOS transistor and NMOS transistor are turned on (switched on), and the turn-on resistance can be made lower than in the cases of FIG. 6B and FIG. 5C.

Figure 5E:
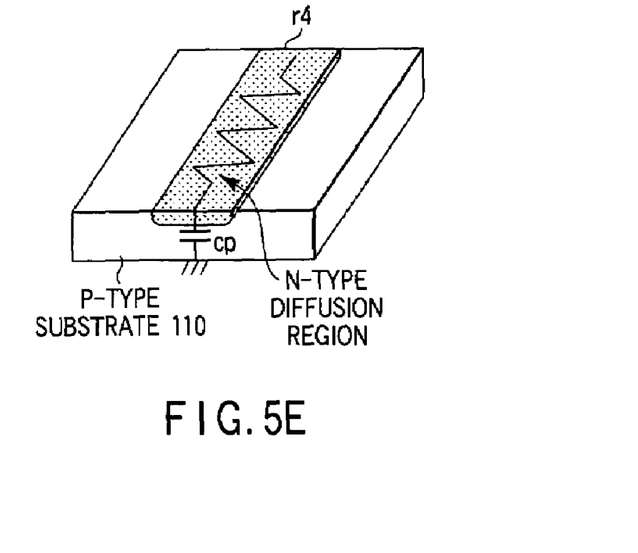
FIG. 5E schematically shows a parasitic capacitance of a diffusion resistance in a semiconductor device shown in FIG. 5A.

In the case where the semiconductor substrate 110 is of P-type as shown in FIG. 5E, the first to eighth resistor elements r1 to r4 and R1 to R4 are resistor elements formed of N-type impurity regions diffused on the P-type semiconductor substrate 110. The impurity diffused resistor element r4, for example, is formed in the substrate 110 as shown in FIG. 5E. FIG. 5E schematically shows a state in which an N-type diffusion region (resistor element r4) formed on the P-type semiconductor substrate 110 has a parasitic capacitance Cp. In the case where the semiconductor substrate is of N-type (not shown), the first to eighth resistor elements r1 to r4 and R1 to R4 may be resistor elements formed of P-type impurity regions diffused on the N-type semiconductor substrate.

The operations of the present embodiment in the active mode and in the standby mode will now be described in detail.

(Active Mode)

Assume that in the active mode, a load connected to the output terminal 15 increased and a voltage drop occurred at the node N2. In this case, the switches 16 to 19 are closed by the mode designation signal which is output from the mode controller 5 and turns on the switches 16 to 19. At this time, the voltage supplied from the power supply terminal 13 is divided by the resistor elements R1, R2, R3 and R4 as well as by the resistor elements r1, r2, r3 and r4. Most of current in the voltage-division circuit composed of these elements flows through the resistor elements r1 to r4 since the resistance values of the resistor elements R1 to R4 are sufficiently higher than those of the resistor elements r1 to r4.

Accordingly, a potential variation due to a variation in load, which appears at the node NREF, is quicker in the active mode than in the standby mode in which the switches 16 to 19 are opened. In short, the potential drops quickly in response to a variation in load. Thus, the potential at the input terminal 11, to which the reference potential from the node NREF is input, drops quickly in accordance with the variation in load and the output voltage value obtained from the comparison circuit 12 lowers quickly. Hence, the voltage applied to the gate of the PMOS transistor 14 lowers quickly, too.

As a result, the conduction level of the PMOS transistor 14 increases and the amount of current flowing from the power supply terminal 13 to the output terminal 15 and output setting unit 2 via the node N2 increases quickly and the potential at the node N2 rises. In this manner, the potential that has dropped due to the load connected to the output terminal 15 is raised. Further, the reference potential NREF increases due to the high voltage applied to the output setting circuit 2, and the potential fed back to the output adjusting circuit 1 rises.

In brief, in the case where a load is connected to the output terminal 15 and a desired high voltage needs to be applied to the node N2, the quick application of high voltage in the active mode can quickly stabilize the potential at the output terminal 15.

(Standby Mode)

When a load connected to the output terminal 15 is disconnected, this state is told to the mode controller 5. The mode controller 5 outputs the mode designation signal for turning off the switches 16 to 19, thus opening the switches 16 to 19. As a result, the voltage, which is supplied from the power supply terminal 13 and applied between the power supply terminal 13 and reference potential terminal N1, is divided by only the voltage-division circuit comprising the resistor elements R1, R2, R3 and R4.

Since the resistance values of the resistor elements R1 to R4 are sufficiently higher than those of the resistor elements r1 to r4, the amount of current flowing to the output setting unit 2 is much smaller than in the active mode. Accordingly, the amount of current flowing to the PMOS transistor 14 is very small and the power consumption of the entire circuit is small.

In summary, when a load connected to the output terminal 15 is disconnected, a factor of voltage variation at the reference node NREf is eliminated and there is no need to perform a quick feedback control operation. It is thus unnecessary to supply a large current to the output setting unit 2. Furthermore, since the resistor elements R1 to R4 in the output setting unit 2 are set at high resistance values, the amount of current flowing to the entire output setting unit 2, that is, the power consumption, can be reduced. Hence, an excess standby power can be reduced.

As described above, the resistor elements r1 to r4 and R1 to R4 of the output setting unit 2 shown in FIG. 5A are fabricated to have the ratios: r1/r2=R1/R2~1, and r3/r4=R3/R4~1. Thus, the potentials at nodes NX3 and NX4 of the output setting circuit 3 are equal, and the potentials at nodes NX1 and NX2 of the output setting circuit 4 are equal in the active mode. The parasitic capacitance of resistor r1 and r2 are substantially same. Accordingly, at the time of transition to the standby mode, the charge in the parasitic capacitance of r1 and r2 are canceled out and does not affect on the potential at the node NX2. When the active mode is switched to the standby mode, the potential at the node NREF does not become unstable in spite of the parasitic capacitances in the respective resistor elements.

The reason for this is explained in greater detail, referring to the first output setting circuit 4. When the ratios in resistance value between the resistor elements r1 and r2 and between the resistor elements R1 and R2 in the first output setting circuit 4 have the relationship, r1/r2=R1/R2~1, the voltage applied to the resistor element r1 and resistor element R1 are equal in each of the active mode. Similarly, the voltage applied to the resistor elements r2 and R2 is equal.

When the switches 18 and 19 are opened, the charges in the parasitic capacitance at resistors r1 and r2 are redistributed. The potential of r1 and r2 at other side of NX2 node become same as that of NX2 because no current flow through r1 or r2 when the switches 18 and 19 are open. The charges (Q=CV) at r1 and r2 have same value and opposite sign to each other, because the absolute absolute value of the potential is same from node NX2 and the parasitic capacitances are same. Consequently charges on the resistors are canceled out and do not affect the potential of node NX2.

In other words, in each of the cases where the active mode is switched to the standby mode and the standby mode is switched to the active mode, no potential difference occurs between the node NX1 and node NX2. Therefore, whichever mode is selected, no current flows between the node NX1 and node NX2.

Hence, no charge associated with the parasitic capacitance occurring at the resistor elements r1 and r2 flows between the node NX1 and node NX2. No potential variation occurs at the reference node NREF due to the switching of the mode.

In the second output setting circuit 3, too, the ratios in resistance value are set to be r3/r4=R3/R4~1. Thus, by the same function, parasitic capacitance does not adversely affect the potential at the reference node NREF at the time of mode switching.

Furthermore, when the standby mode is switched to the active mode, no potential variation occurs at the reference node NREF.

As has been described above, the present embodiment can provide a semiconductor device that is capable of performing a stable output voltage control with a short response time, since no potential variation occurs at the reference node NREF whichever mode, the standby mode or active mode, is selected.

Figure 6A:
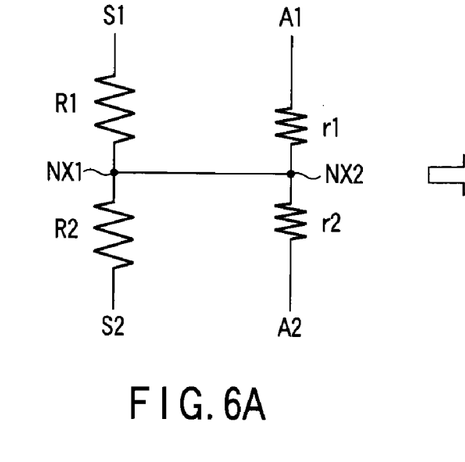
FIG. 6A shows a first output setting circuit according to the first embodiment.
Figure 6B:
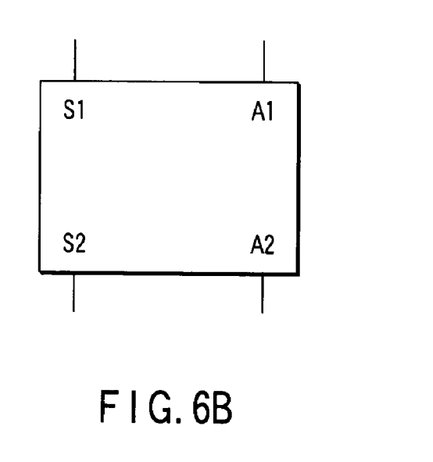
FIG. 6B is a block diagram illustrating the first output setting circuit shown in FIG. 6A.

FIG. 6A is a modeled circuit diagram of the first output setting circuit 4 shown in FIG. 5A. FIG. 6B is a block diagram illustrating the first output setting circuit 4 shown in FIG. 6A.

Specifically, in the block diagram of FIG. 6B, the resistor elements R1 and R2 have ends S1 and S2, which are opposite to those ends thereof connected to the node NX1, and the resistor elements r1 and r2 have ends A1 and A2, which are opposite to those ends thereof connected to the node NX2.

Figure 7:
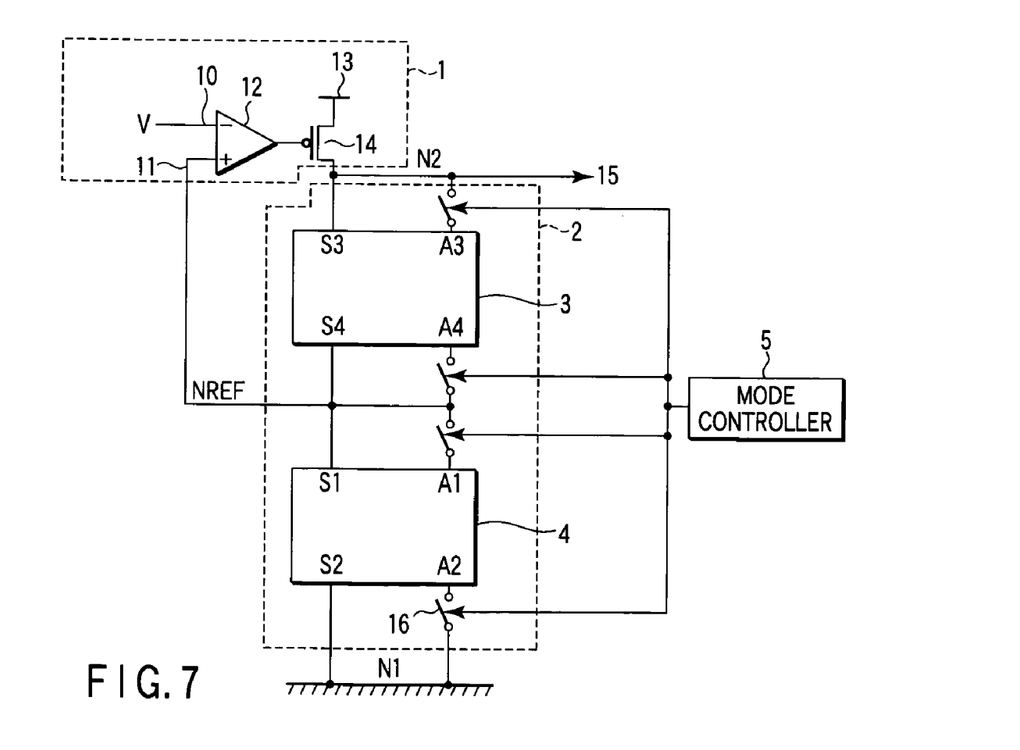
FIG. 7 is a circuit block diagram showing, the semiconductor device with the resistor elements according to the first embodiment shown in FIG. 5A using the block diagram of FIG. 6B.

FIG. 7 is a block diagram of a semiconductor device with resistor elements formed on the semiconductor substrate, wherein the output setting unit 2 shown in FIG. 5A is depicted by a block diagram according to FIG. 6B. That is, according to FIG. 6B, the first output setting circuit 4 and second output setting circuit 3 are depicted by blocks.

In the second output setting circuit 3 shown in the block diagram of FIG. 7, ends of the resistor elements R3 and R4, which are opposite to the ends thereof connected to the node NX3, are designated by S3 and S4, and ends of the resistor elements r3 and r4, which are opposite to the ends thereof connected to the node NX4, are designated by A3 and A4.

Assume that the resistor elements of the output setting unit 2 satisfy the relationships: R1=R2, R3=R4, r1=r2 and r3=r4. And an adverse effect due to parasitic capacitance at the time of mode switching can be eliminated.

Second Embodiment

Figure 8:
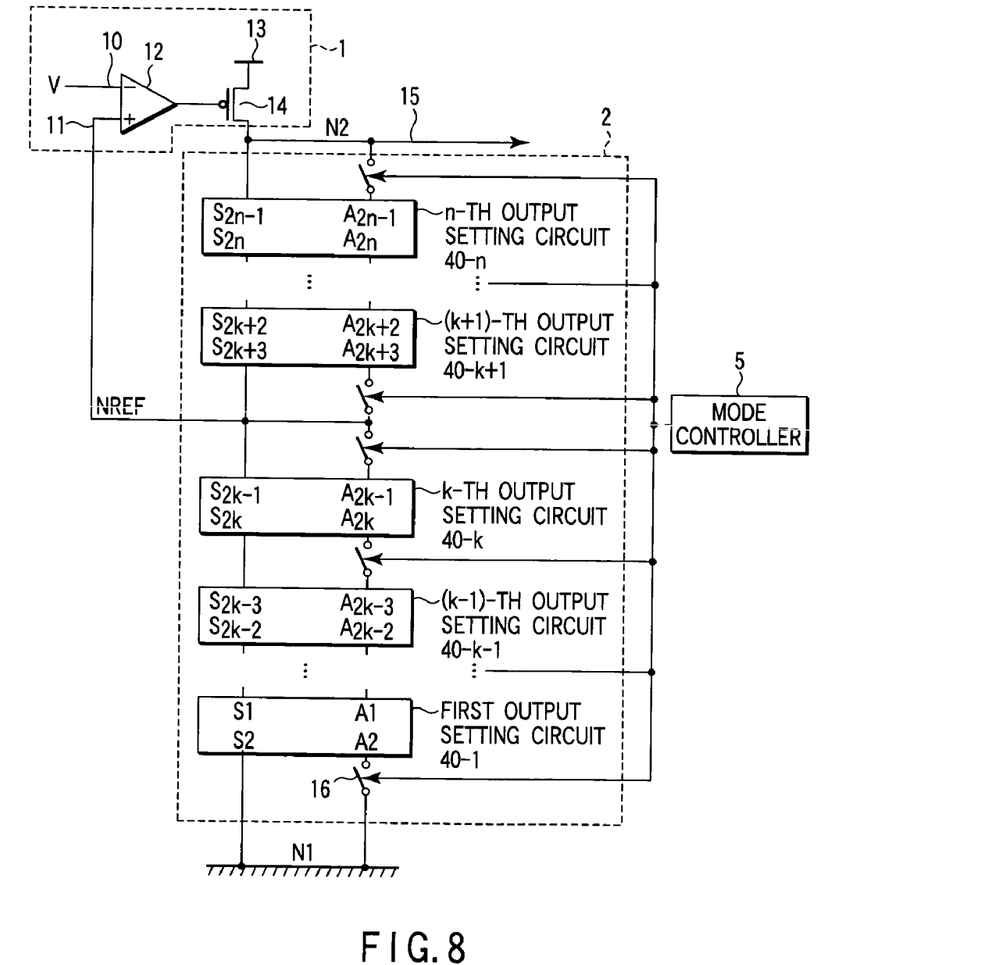
FIG. 8 is a circuit block diagram showing the structure of a semiconductor device with resistor elements, according to a second embodiment of the invention.

FIG. 8 is a block circuit diagram of a semiconductor device with resistor elements formed on the semiconductor substrate, wherein an n-number of output setting circuits are depicted by blocks. In this semiconductor device, a reference potential, which is fed back in accordance with one of two modes, i.e. an active mode or a standby mode, in the output setting unit 2 is switched by the output adjusting circuit 1 and delivered to the output terminal 15 and the output setting unit 2.

Those parts in the embodiment shown in FIG. 8, which are common to the parts of the first embodiment, are denoted by like reference numerals, and a description thereof is omitted. Only the differences from the first embodiment are described.

As shown in FIG. 8, the output setting unit 2 includes an n-number (n=a natural number, n≧2) of output setting circuits represented by blocks, i.e. a first output setting circuit 40-1 to an n-th output setting circuit 40-n.

Specifically, the output setting unit 2 includes an n-number (n=a natural number, n≧2) of output setting circuits, i.e. the first output setting circuit 40-1 to the n-th output setting circuit 40-n. The n-th output setting circuit 40-n includes at least a (4n−3)-th resistor element $R_{2n-1}$ and a (4n−2)-th resistor element $R_{2n}$, which are connected in series in the standby mode between the output terminal 15 and reference node NREF via a (2n−1)-th voltage-division node NX2n−1, and also includes at least a (4n−1)-th resistor element $r_{2n-1}$ and a 4n-th resistor element $R_{2n}$, which are connected in series in the active mode between the output terminal 15 and reference node NREF via a 2n-th voltage-division node NX2n connected to the (2n−1)-th voltage-division node NX2n−1. The resistance value of (4n−3)-th resistor element and that of (4n−2)-th resistor element is set to be substantially same. Also, the resistance value of (4n−1)-th resistor element and that of 4n-th resistor element is set to be substantially same. (R2n−1∼R2n, r2n−1∼r2n ).

The first output setting circuit 40-1 to the n-th output setting circuit 40-n are depicted by blocks in the same manner as illustrated in FIG. 6A and FIG. 6B. In the n-th output setting circuit 40-n, ends of the resistor elements $R_{2n}$ and $R_{2n-1}$, which are opposite to the ends thereof connected to the node NX2n−1, are designated by $S_{2n}$ and $S_{2n-1}$. On the other hand, ends of the resistor elements $r_{2n}$ and $r_{2n-1}$, which are opposite to the ends thereof connected to the node NX2n, are designated by $A_{2n}$ and $A_{2n-1}$.

Of the first to n-th output setting circuits, the two output setting circuits provided immediately on both sides of the reference node NREF are designated as a k-th output setting circuit 40-k and a (k+1)-th output setting circuit 40-k+1 (k=a natural number, 2≦k<n).

In this embodiment, too, the resistance values in each pair of resistor elements are set to be substantially same. For example, in the n-th setting circuit 40-n, the resistance value of the (4−n3)-th resistor element $R_{2n-1}$ is same as resistance value of the (4n−2)-th resistor element $R_{2n}$, and the resistance value of the (4n−1)-th resistor element $r_{2n-1}$ is same as the resistance value of the 4n-th resistor element $r_{2n}$ ($R_{2n-1}=R_{2n}$ and $r_{2n-1}=r_{2n}$).

No potential variation occurs at the reference node NREF due to parasitic capacitance when switching is made between both modes. The reason is that even if one mode is switched to the other mode, the charge in the parasitic capacitance of $r_{2n-1}$ and $r_{2n}$ are canceled out and does not affect on the potential at the node NX2n . For instance, in the n-th output setting circuit 40-n, whichever mode is selected, no potential difference occurs between the node NX2n and node NX2n−1.

As described above by dividing the output setting unit 2 into an n-number of small-scale output setting circuits, an adverse effect on potential due to parasitic capacitance can be eliminated in units of a small-scale output setting circuit even at the time of mode switching. It is thus possible to divide the voltage applied between the node N1 and node N2 into n-portions, and to prevent potential variation at the reference node NREF even when either mode is selected. As a result, even if a variation occurs in the output voltage due to a variation in load, etc., a quick, exact control can be effected to promptly apply a desired voltage to the output terminal 15.

In addition, by minutely dividing the voltage, a further potential variation is prevented from occurring at the reference node NREF when either of the modes is selected. As a result, a desired voltage can be applied to the output terminal 15 more promptly. As the number n of output setting circuits between the reference potential terminal N1 and node N2 is increased, the resistance value in each individual output setting circuit can be reduced to a smaller division. Therefore, the value of parasitic capacitance in each resistor element can be more minutely divided.

In the above-described case where the resistance values of the high-resistance resistor elements and the resistance values of the low-resistance resistor elements are respectively equal in each output setting circuit, the potential value to be fed back can selectively be determined by the position of connection of the reference node NREF. The reason is that although the voltage supplied from the power supply terminal 13 is divided into n-components by the output setting circuits 40-1 to 40-n, the potential to be fed back is determined only by connecting the reference node NREF to a position where a desired voltage value is obtainable. For example, when it is desired to apply half the voltage to the reference node NREF, the reference node NREF is connected to the position of n/2.

As the number n is increased, the voltage applied between the node N2 and node N1 is more minutely divided. Accordingly, the voltage to be fed back can be more finely set at a desired value.

Of course the resistance values of the resistors in the each output setting circuit may vary from each other. The point of according to this embodiment is that two high resistance resistor elements in an output setting circuit has same resistor value and low-resistance resistor elements in an output setting circuit has same resistor value to cancel the charges in the parasitic capacitance of the low-resistance resistor elements when the mode is switched from/to active and standby.

As has been described above, without varying impurity concentrations for respective resistor elements, the resistor elements can be formed in the same semiconductor device. This can reduce the manufacturing cost and, in addition, a semiconductor device capable of obtaining desired feedback potential can be provided.

Third Embodiment

Figure 9:
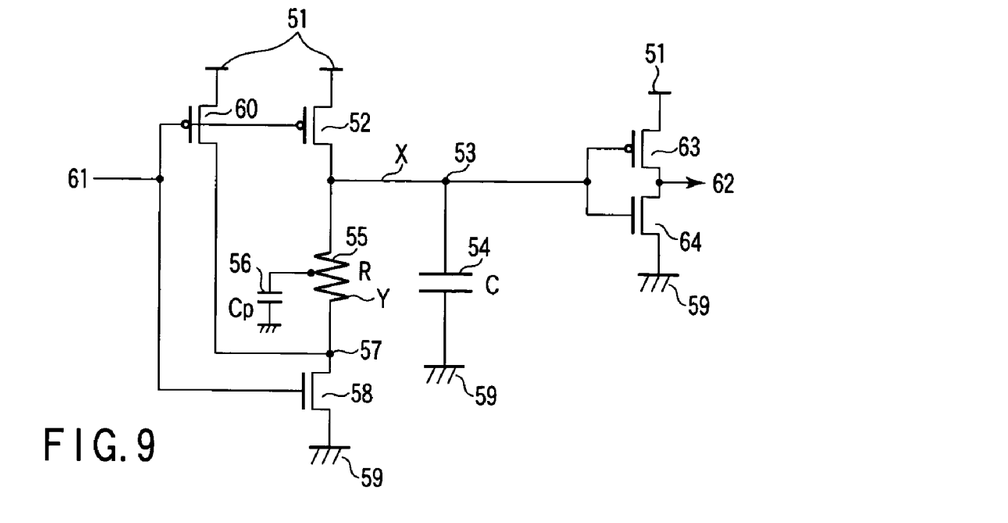
FIG. 9 is an equivalent circuit diagram of a semiconductor device with a resistor element, according to a third embodiment of the invention.
Figure 10:
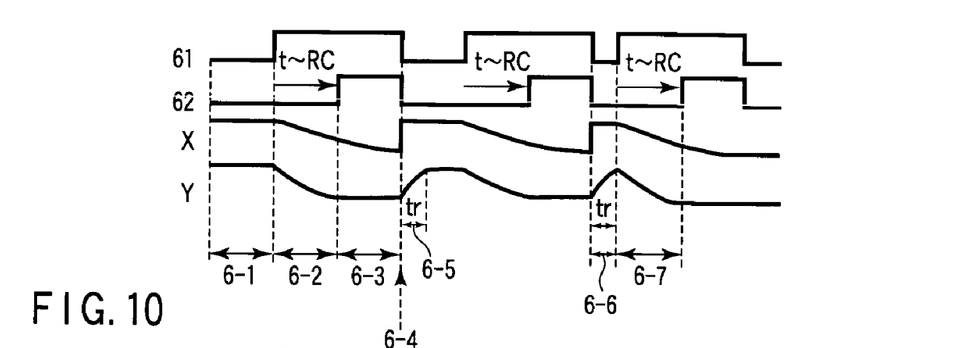
FIG. 10 is an operational waveform chart relating to the semiconductor device with the resistor element according to the third embodiment shown in FIG. 9.

FIG. 9 shows an equivalent circuit of a semiconductor device having a parasitic capacitance along with a resistor element formed on a semiconductor substrate, according to a third embodiment of the present invention. FIG. 10 shows operational waveforms in the equivalent circuit. This embodiment corresponds to the prior art shown in FIG. 3 and FIG. 4.

In FIG. 9, a first charging circuit is connected between a first power supply terminal 51 and a second power supply terminal (ground terminal) 59. The first charging circuit includes a resistor element 55 and a PMOS transistor 52 having a source connected to the first power supply terminal 51, a drain connected to one end of the resistor element 55, and a gate connected to an input terminal 61. A second charging circuit, which includes a PMOS transistor 60 having a drain connected to a node 57 that is connected to the other end of the resistor element 55, a source connected to the first power supply terminal 51, and a gate connected to the input terminal 61, is connected in parallel with the first charging circuit.

A discharging circuit is connected in series with the first charging circuit between the power supply terminals 51 and 59. The discharging circuit includes a capacitor 54 having one end connected to a node 53 that is connected to one end of the resistor element 55, and the other end connected to the second power supply terminal 59, and an NMOS transistor 58 having a source connected to the second power supply terminal 59, a drain connected to the node 57 that is connected to the other end of the resistor element, and a gate connected to the input terminal 61.

The resistor element 55 is formed by diffusion, for example, as shown in FIG. 5E. It, therefore, has a parasitic capacitance 56. Assume that the value of the parasitic capacitance 56 is Cp. The node 53 is connected to an output terminal 62 via an output buffer circuit comprising a PMOS transistor 63 and an NMOS transistor 64.

The operation of this equivalent circuit will now be described.

If a potential at logic level "L" is applied to the input terminal 61, the potential "L" appears at the gate of the PMOS transistor 60, the gate of the PMOS transistor 52 and the gate of the NMOS transistor 58. Accordingly, the PMOS transistor 60 and PMOS transistor 52 are turned on, and the NMOS transistor 58 is turned off.

The PMOS transistor 60 is thus rendered conductive, and a node (57)-side potential Y of the resistor element 55 connected to the power supply terminal 51 is set at "H" level. Similarly, the PMOS transistor 52 is rendered conductive, and a node (X)-side potential of the resistor element 55 connected to the power supply terminal 51 and a potential of the capacitor 54 connected to the node 53 are set at "H" level.

Further, the potential "H" at the node 53 is applied to the gates of the PMOS transistor 63 and NMOS transistor 64. Accordingly, the PMOS transistor 63 is turned off and the NMOS transistor 64 is turned on. As a result, an "L" level potential is produced from the output terminal 62.

As described above, when potential "L" is applied to the input terminal 61, the potential X of the capacitor 54 and the potential Y of the resistor element 55 are precharged to "H" level, as shown in FIG. 10 (time period 6-1 in FIG. 10).

Next, if a potential "H" is applied to the input terminal 61, the potential "H" appears at the gate of the PMOS transistor 60, the gate of the PMOS transistor 52 and the gate of the NMOS transistor 58. Accordingly the PMOS transistor 60 and PMOS transistor 52 are turned off and the NMOS transistor 58 is turned on.

Upon the turning-on of the NMOS transistor 58, the charge accumulated in the capacitor 54 is discharged to the power supply terminal 59 via the resistor element 55. The time needed for the discharge is approximately equal to a time constant (t~RC) obtained by multiplying R by C, where R is the resistance value of the resistor element 55 and C is the capacitance value of the capacitor 54. Making use of the time constant, a delay is intentionally added to the time for transmission of a signal from the input terminal 61 to the output terminal 62.

If the charge accumulated in the capacitor 54 and resistor element 55 is completely discharged to the power supply terminal 59 by the turning-on of the NMOS transistor 58, the potential X at the node 53 falls to "L". Consequently, the potential "L" at the node 53 is applied to the gates of the PMOS transistor 63 and NMOS transistor 64. Accordingly, the PMOS transistor 63 is turned on and the NMOS transistor 64 is turned off. As a result, a potential at "H" level is produced from the output terminal 62 with a desired time delay t (time period 6-2 in FIG. 10).

In the semiconductor device of this embodiment, as described above, a desired delay time (t~RC) is provided between the time when the input terminal 61 rises to "H" level and the time when the output terminal 62 rises to "H" level.

When the potential at the input terminal 61 falls again to "L" level after a predetermined time period in which the potential at the output terminal 62 is at "H" level (time period 6-3 in FIG. 10), the potential X of the capacitor rises to "H" level by the same operation and an "L" level potential appears at the output terminal 62 without delay (time period 6-4 in FIG. 10).

However, since the parasitic capacitance 56 is added to the resistor element 55, a predetermined time tr is needed, as indicated by time 6-5 in FIG. 10, in order to completely charge the resistor element 55 to raise its potential Y to "H" level. The time needed for the charging is about RCp, where Cp is the capacitance value of the parasitic capacitance 56 of resistor element 55 and R is the resistance value of the resistor element 55.

In this embodiment, the PMOS transistor 60 is added. Thus, even when the potential at the input terminal falls to "L" (time period 6-4 in FIG. 10), the PMOS transistor 52 and PMOS transistor 60 can charge the resistor element 55 from both sides, and the internal potential Y of the resistor element 55 can quickly be raised to "H" level.

Accordingly, the time tr needed for charging the resistor element 55 to raise its potential Y to "H" can be made much shorter than that in the prior art (time period 6-5 in FIG. 10). In other words, even where the time tr is shorter than the time tr', in which the potential of the resistor element in the prior art in FIG. 4 rises to "H", relative to the reset time in which the input terminal 61 is at "L" level, the potential Y of the resistor element 55 can quickly be raised to "H". Therefore, a delay of a desired delay time constant t~RC can be obtained (time period 6-7 in FIG. 10).

Fourth Embodiment

Figure 11:
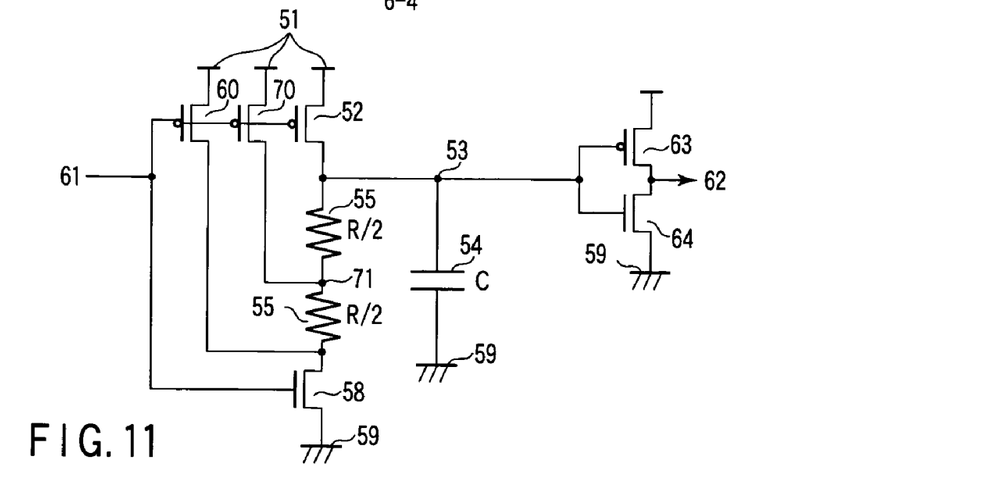
FIG. 11 is a circuit diagram of a semiconductor device with a resistor element, according to a fourth embodiment of the invention.

FIG. 11 shows a fourth embodiment of the present invention. FIG. 11 is a circuit diagram of a semiconductor device having resistor elements formed on a semiconductor substrate, which is used to obtain a desired delay time, as described above. In the fourth embodiment, the third embodiment shown in FIG. 9 is improved.

A PMOS transistor 70 is added to the structure of the third embodiment. That is, the fourth embodiment further comprises a third charging circuit including the PMOS transistor 70, which has a source connected to the first power supply terminal 51, a drain connected to a node 71 located at a midpoint of the resistor element 55, and a gate connected to the input terminal 61.

The parts in the fourth embodiment, which are common to those of the third embodiment, are denoted by like reference numerals, and a description thereof is omitted. Only the differences from the third embodiment are described in detail.

If a potential "L" is applied to the input terminal 61, the potential "L" appears at the gate of the PMOS transistor 70, the gate of the PMOS transistor 60, the gate of the PMOS transistor 52 and the gate of the NMOS transistor 58. Accordingly, the PMOS transistor 70, PMOS transistor 60 and PMOS transistor 52 are turned on, and the NMOS transistor 58 is turned off.

Upon the turning-on of the PMOS transistor 60, a potential "H" is applied from the power supply terminal 51 to that end of the resistor element 55, which is located on the NMOS transistor 58 side. In addition, upon the turning-on of the PMOS transistor 52, a potential "H" is applied from the power supply terminal 51 to that end of the resistor element 55, which is located on the PMOS transistor 52 side. Further, the potential X of the capacitor 54 connected to the node 53 is raised to "H". Moreover, upon the turning-on of the PMOS transistor 70, the potential from the power supply terminal 51 flows to the midpoint node 71 of the resistor element 55 to raise the potential of the resistor element 55 to "H".

When the potential at the node 53 rises to "H", the potential "H" is applied to the gates of the PMOS transistor 63 and NMOS transistor 64. Accordingly, the PMOS transistor 63 is turned off and the NMOS transistor 64 is turned on. As a result, a potential "L" is produced from the output terminal 62.

Then, if a potential "H" is applied to the input terminal 61, the potential "H" appears at the gate of PMOS transistor 70, the gate of PMOS transistor 60, the gate of PMOS transistor 52 and the gate of NMOS transistor 58. Accordingly, the PMOS transistor 70, PMOS transistor 60 and PMOS transistor 52 are turned off, and the NMOS transistor 58 is turned on.

Upon the turning-on of the NMOS transistor 58, the charge accumulated in the capacitor 54 is discharged to the power supply terminal 59 via the resistor element 55. The time needed for the discharge is approximately equal to a time constant (t~RC) obtained by multiplying R by C, where R is the resistance value of the resistor element 55 and C is the capacitance value of the capacitor 54. Making use of the time constant, a delay is intentionally added to the time for transmission of a signal from the input terminal to the output terminal.

After the delay, the NMOS transistor 58 is rendered conductive and the potential at the node 53 falls to "L". Consequently, the potential "L" at the node 53 is applied to the gates of the PMOS transistor 63 and NMOS transistor 64. The PMOS transistor 63 is turned on and the NMOS transistor 64 is turned off. As a result, a potential "H" appears at the output terminal 62.

The operational waveforms in this case are basically the same as shown in FIG. 10, so a description is omitted here.

In this embodiment, the additional PMOS transistor 70 is connected to the node 71 located at the midpoint of the resistor element 55 where the resistance value is halved. Thus, the node 71 can quickly be charged to "H". Thereby, the internal potential of the resistor element 55 can be charged to "H" more quickly than in the previous embodiment. Therefore, even where the reset time is still shorter than in the third embodiment, the delay of desired time constant t~RC can be obtained.

In general, it is desirable that the position of the node 71 be at a point corresponding exactly to the midpoint of the resistance value of the resistor element. However, it is not necessary to position the node 71 at this point. The position of the node 71 is desired to be at a point where the multiplied value of resistance and parasitic capacitance is exactly halved.

In general terms, the parasitic capacitance also depends on, for instance, an application voltage to the resistor element. Therefore, the position where the resistance of the resistor element takes a middle value does not necessarily correspond to the position where the multiplied value of resistance and parasitic capacitance takes a middle value.

In the third and fourth embodiments, two or three PMOS transistors are used to charge the node X of the resistor element 55. However, the number of PMOS transistors may be greater. As stated above, the position where the resistor elements 55 is charged by the added plural PMOS transistors should preferably be a point where the parasitic capacitance can be charged as quick as possible.

At least the second and third charging circuits may have the same driving performance as the first charging circuit, but they may differ. For example, the PMOS transistor 60, PMOS transistor 70 and other additional plural PMOS transistors may have a lower driving performance than the PMOS transistor 52.

The reason is that while the PMOS transistor 60 and PMOS transistor 70 are used mainly for the purpose of charging the parasitic capacitance in the resistor element, the PMOS transistor 52 is used mainly for charging the capacitor 54.

Fifth Embodiment

Figure 12:
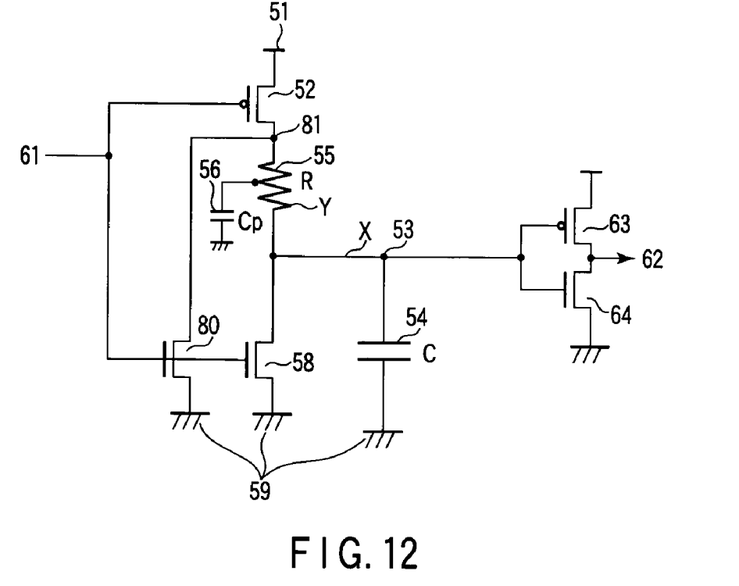
FIG. 12 is an equivalent circuit diagram of a semiconductor device with a resistor element, according to a fifth embodiment of the invention.
Figure 13:
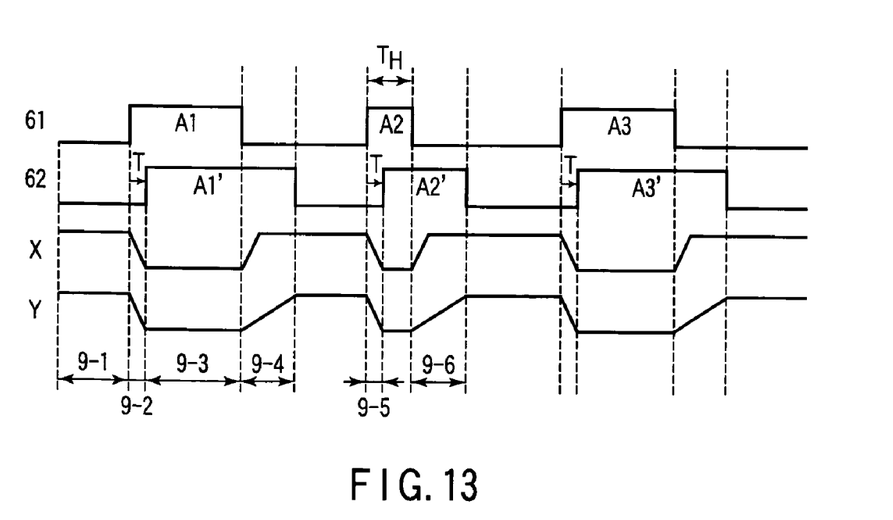
FIG. 13 is an operational waveform chart relating to the semiconductor device with the resistor element according to the fifth embodiment shown in FIG. 12.

FIG. 12 shows a fifth embodiment of the present invention. FIG. 12 is an equivalent circuit diagram of a semiconductor device having a resistor element formed on a semiconductor substrate. FIG. 13 shows operational waveforms in the equivalent circuit according to this embodiment.

The embodiment of FIG. 12 is a semiconductor device comprising a resistor element 55; a first discharging circuit including an NMOS transistor 58 having a source connected to a first power supply terminal 59, a drain connected to a node 53 that is connected to one end of the resistor element 55, and a gate connected to an input terminal 61; a second discharging circuit including an NMOS transistor 80 having a drain connected to a node 81 that is connected to the other end of the resistor element 55, a source connected to the first power supply terminal 59, and a gate connected to the input terminal 61; and a charging circuit including a PMOS transistor 52 having a drain connected to the node 81 that is connected to the other end of the resistor element 55, a source connected to a second power supply terminal 51, and a gate connected to the input terminal 61.

The parts common to those in the third embodiment are denoted by like reference numerals, and an overlapping description is omitted here.

In the third embodiment shown in FIG. 9, the parasitic capacitance of the resistor element 55 is quickly charged by the potential supplied from the first power supply terminal 51, which is a positive power supply, via the PMOS transistor 60, and a desired delay time can be obtained at the time of discharging the capacitor 54. In particular, even where the reset time in which the potential at the input terminal 61 falls to "L" is shorter than RCp, a desired delay time can be obtained.

In the present embodiment shown in FIG. 12, the NMOS transistor 80 facilitates the discharge of the charge in the parasitic capacitance of the resistor element 55 to the power supply terminal 59 that is the ground power supply. Thus, the time in which the potential Y of the resistor element 55 on the node X side falls to "L" is shortened, thereby obtaining an output signal that rises to "H" with a predetermined time delay T after the input signal falls to "L". Furthermore, even if the input signal rises to "H" in a relatively short time period after it fell to "L", a corresponding delay time of input "L" level signal to output "L" level signal can be obtained without fail.

The operation of the present embodiment will now be described.

If a potential "L" is applied to the input terminal 61, the potential "L" appears at the gate of the PMOS transistor 52, the gate of the NMOS transistor 58 and the gate of the NMOS transistor 80. Thus, the PMOS transistor 52 is turned on, and the NMOS transistor 58 and NMOS transistor 80 are turned off.

The potential at the power supply terminal 51 flows through the PMOS transistor 52 and resistor element 55 and raises the potential X of the capacitor 54 connected via the node 53 up to "H" level.

Then, the potential "H" at the node 53 is applied to the gates of the PMOS transistor 63 and NMOS transistor 64. The PMOS transistor 63 is turned off, and the NMOS transistor 64 is turned on. As a result, a potential "L" is produced from the output terminal 62 with a predetermined delay (time period 9-1 in FIG. 13).

If a potential "H" is applied to the input terminal 61 (input A1 in FIG. 13), the potential "H" appears at the gate of the PMOS transistor 52, the gate of the NMOS transistor 58 and the gate of the NMOS transistor 80. The PMOS transistor 52 is turned off and the NMOS transistor 58 and NMOS transistor 80 are turned on.

Upon turning-on of the NMOS transistor 58 and NMOS transistor 80, the charge accumulated in the capacitor 54 and resistor element 55 is discharged quickly via these transistors to the power supply terminal 59.

Then, the NMOS transistor 58 and NMOS transistor 80 are rendered conductive and the potential at the node 53 falls to "L" due to the power supply terminal 59. Consequently, the potential "L" at the node 53 is applied to the gates of the PMOS transistor 63 and NMOS transistor 64. The PMOS transistor 63 is turned on and the NMOS transistor 64 is turned off. As a result, a potential "H" appears at the output terminal 62, and an output signal A1' is produced (time period 9-2, 9-3 in FIG. 13).

If the potential at the input terminal 61 falls again to "L" after the output of the input signal A1, the potential at the output terminal remains at "H" without immediate variation in the output.

At this time, as shown in FIG. 13, the potential X of the capacitor 54 rises toward "H" level as charging the capacitor element 54 to the voltage level of power supply terminal 51 through PMOS transistor 52 and resistor element 55. In other words, a delay is intentionally added to the time for transmission of a signal from the input terminal to the output terminal with a delay time T=RC, where R is the resistance value of resistor element 55 and C is the capacitance value of capacitor element 54.

If the potential at the node X rises to a predetermined value, the transistor 64 is turned on and the output signal A1' falls to "L" (an intermediate point in time period 9-4 in FIG. 13).

At the beginning of a time period 9-5, the potential at the input terminal 61 rises to "H" and an input signal A2 is input. Then, the potential at the nodes X and Y begins to quickly fall due to the operation of the discharging circuits of the transistors 58 and 80. Accordingly, the transistor 63 is turned on, and the potential at the output terminal 62 rises to "H" after a delay time T. Thus, a desired output signal A2' is produced (time period 9-6 in FIG. 13).

As has been described above, since the discharge of the charge of the parasitic capacitance in the resistor element 55 can also be facilitated by the NMOS transistor 80, the internal potential Y in the resistor element 55 can quickly be lowered to "L". Therefore, even where the time in which the potential of the input terminal is at "H" is short, as indicated by TH in FIG. 13, the output signal A2' with a desired delay time T can be obtained.

Sixth Embodiment

Figure 14:
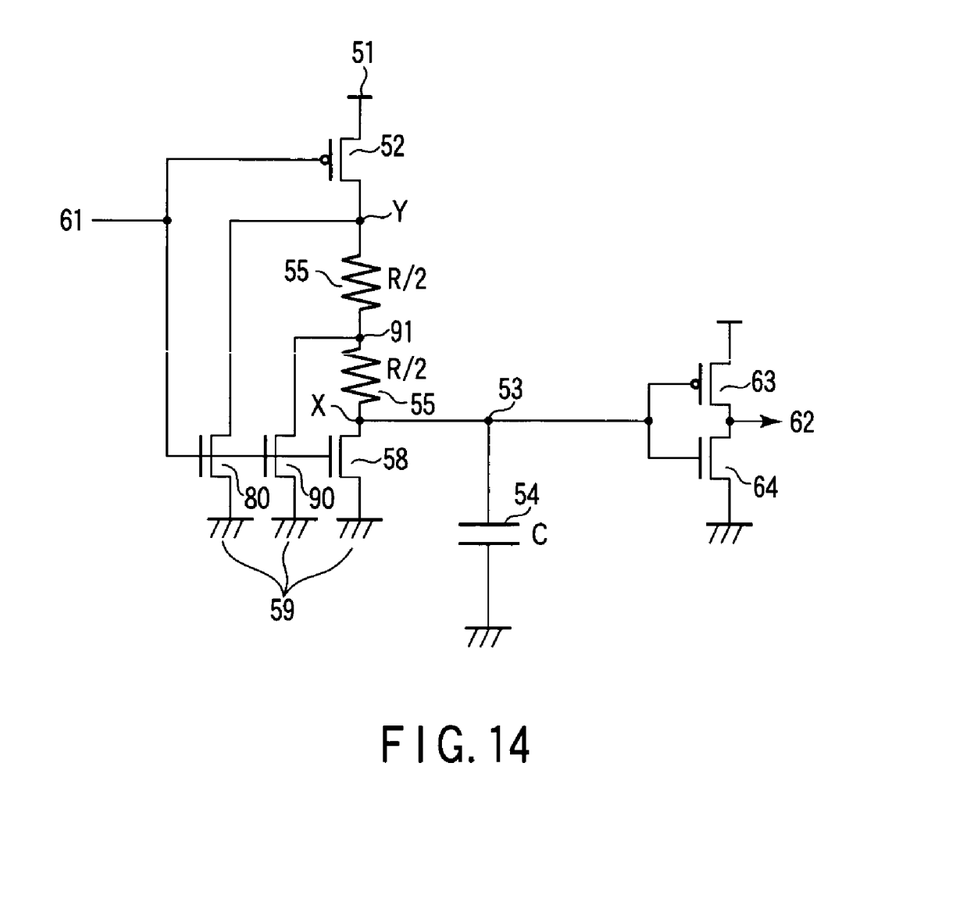
FIG. 14 is a circuit diagram of a semiconductor device with a resistor element, according to a sixth embodiment of the invention.

FIG. 14 shows a sixth embodiment of the present invention. FIG. 14 is a circuit diagram of a semiconductor device having a resistor element formed on a semiconductor substrate. Like each of the preceding embodiments, the semiconductor device is used to obtain a desired delay time between the input and output terminals.

Compared to the fifth embodiment, the sixth embodiment further includes a NMOS transistor 90. That is, the semiconductor device of the sixth embodiment includes a third discharge circuit comprising the NMOS transistor 90, which has a gate connected to the input terminal 61, a source connected to the first power supply terminal 59, and a drain connected to a node 91 located at a position corresponding to a middle point of the resistance value of the resistor element 55.

The parts common to those of the fifth embodiment are denoted by like reference numerals, and an overlapping description is omitted here. The operational differences from the fifth embodiment will be described in detail.

If a potential "L" is applied to the input terminal 61, the potential "L" appears at the gate of the PMOS transistor 52, the gate of the NMOS transistor 58, the gate of the NMOS transistor 80 and the gate of NMOS transistor 90. Thus, the PMOS transistor 52 is turned on, and the NMOS transistor 58, NMOS transistor 80 and NMOS transistor 90 are turned off.

The potential at the power supply terminal 51 flows through the PMOS transistor 52 and the resistor element 55, thereby raising the potential Y of the resistor element 55 and the potential X of the capacitor 54 connected to the node 53 up to "H" level. In other words, a delay is intentionally added to the time for transmission of a signal from the input terminal to the output terminal with a delay time T=RC, where R is the resistance value of resistor element 55 and C is the capacitance value of capacitor element 54.

Then, the potential "H" at the node 53 is applied to the gates of the PMOS transistor 63 and NMOS transistor 64. The PMOS transistor 63 is turned off, and the NMOS transistor 64 is turned on. As a result, a potential "L" is produced from the output terminal 62.

If a potential "H" is applied to the input terminal 61, the potential "H" appears at the gate of the PMOS transistor 52, the gate of the NMOS transistor 58, the gate of the NMOS transistor 80 and the gate of the NMOS transistor 90. The PMOS transistor 52 is turned off, and the NMOS transistor 58, NMOS transistor 80 and NMOS transistor 90 are turned on.

Upon turning-on of the NMOS transistor 58, NMOS transistor 80 and NMOS transistor 90, the charge accumulated in the capacitor 54 and resistor element 55 is discharged via these transistors to the power supply terminal 59 quickly.

After the discharge, the potential "L" at the node 53 is applied to the gates of the PMOS transistor 63 and NMOS transistor 64. The PMOS transistor 63 is turned on and the NMOS transistor 64 is turned off. As a result, a potential "H" is produced from the output terminal 62.

The operational waveforms in this embodiment are obvious from the already described embodiments, so a description is omitted here.

In the present embodiment, the charge of the parasitic capacitance of the resistor element 55 can also be discharged via the NMOS transistor 80 and NMOS transistor 90. Accordingly, the time needed until the potential at the node 53 falls to "L" can further be shortened.

Therefore, even if the time in which the potential at the input terminal is at "H" is still shorter than the time constant RCp, where R is the resistance value of the resistor element 55 and Cp is the parasitic capacitance of the resistor element 55, an output signal with a desired delay time relative to the input signal can be obtained.

For the same reason as with the fourth embodiment, it is not necessary that the position of the node 91 be at a location corresponding to a middle point of the resistance value of the resistor element 55. It is desirable that the position of the node 91 be at a location where the multiplied value of resistance and parasitic capacitance is halved.

A plurality of NMOS transistors may be added for the discharge of the resistor element 55. In this case, for the same reason as stated above, the position of the drain of the transistor connected to the resistor element 55 should preferably be at a location where the charge accumulated in the parasitic capacitance can be discharged with maximum efficiency.

For the same reason as with the fourth embodiment, the transistors constituting at least the second and third discharging circuits may have a lower driving performance than the transistor of the charging circuit. That is, the driving performance of each of the NMOS transistor 90, NMOS transistor 80 and added plural NMOS transistors may be lower than that of the NMOS transistor 58.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    an output adjusting circuit which includes a first input terminal supplied with a fixed potential, a second input terminal supplied with a reference potential from a reference node, and an output terminal, and is operable in a standby mode and in an active mode; and
    an output setting unit including a first output setting circuit connected between the reference node and a reference potential terminal, and a second output setting circuit connected between the output terminal and the reference node,
    wherein the first output setting circuit includes at least first and second resistor elements connected in series via a first voltage-division node between the reference node and the reference potential terminal in the standby mode, and at least third and fourth resistor elements connected in series via a second voltage-division node connected to the first voltage-division node between the reference node and the reference potential terminal in the active mode, and a ratio in resistance value between the first resistor element and the second resistor element is substantially equal to a ratio in resistance value between the third resistor element and the fourth resistor element, and
    the second output setting circuit includes at least fifth and sixth resistor elements connected in series via a third voltage-division node between the output terminal and the reference node in the standby mode, and at least seventh and eighth resistor elements connected in series via a fourth voltage-division node connected to the third voltage-division node between the output terminal and the reference node in the active mode, and a ratio in resistance value between the fifth resistor element and the sixth resistor element is substantially equal to a ratio in resistance value between the seventh resistor element and the eighth resistor element.

2. The semiconductor device according to claim 1, wherein the output setting unit includes an n-number of output setting circuits containing a first output setting circuit to an n-th output setting circuit (n: a natural number n≧2), and
    the n-th output setting circuit includes at least a (4n−3)-th resistor element and a (4n−2)-th resistor element connected in series via a (2n−1)-th voltage-division node between the output terminal and the reference node in the standby mode, and at least a (4n−1)-th resistor element and a 4n-th resistor element connected in series via a 2n-th voltage-division node connected to the (2n−1)-th voltage-division node between the output terminal and the reference node in the active mode, and a ratio in resistance value between the (4n−3)-th resistor element and (4n−2)-th resistor element is substantially equal to a ratio in resistance value between the (4n−1)-th resistor element and 4n-th resistor element.

3. The semiconductor device according to claim 1, wherein the output adjusting circuit includes a comparison circuit that compares the reference potential from the reference node and the fixed potential, and a control element that controls an output current to be supplied to the output terminal in accordance with an output from the comparison circuit.

4. The semiconductor device according to claim 1, wherein the first to eighth resistor elements are formed on a major surface of a semiconductor substrate,
    a parasitic capacitance of the first resistor element is substantially equal to a parasitic capacitance of the second resistor element, p1 a parasitic capacitance of the third resistor element is substantially equal to a parasitic capacitance of the fourth resistor element,
    a parasitic capacitance of the fifth resistor element is substantially equal to a parasitic capacitance of the sixth resistor element, and a parasitic capacitance of the seventh resistor element is substantially equal to a parasitic capacitance of the eighth resistor element.

5. The semiconductor device according to claim 2, wherein the (4n−3)-th to 4n-th resistor elements are formed on a major surface of a semiconductor substrate,
a parasitic capacitance of the (4n−3)-th resistor element is substantially equal to a parasitic capacitance of the (4n−2)-th resistor element, and a parasitic capacitance of the (4n−1)-th resistor element is substantially equal to a parasitic capacitance of the 4n-th resistor element.

6. The semiconductor device according to claim 4, wherein the semiconductor substrate is of a P-type, and the first to eighth resistor elements are formed of N-type impurity regions diffused on the P-type semiconductor substrate.

7. The semiconductor device according to claim 5, wherein the semiconductor substrate is of a P-type, and the first to 4n-th resistor elements are formed of N-type impurity regions diffused on the P-type semiconductor substrate.

8. The semiconductor device according to claim 4, wherein the semiconductor substrate is of an N-type, and the first to eighth resistor elements are formed of P-type impurity regions diffused on the N-type semiconductor substrate.

9. The semiconductor device according to claim 5, wherein the semiconductor substrate is of an N-type, and the first to 4n-th resistor elements are formed of P-type impurity regions diffused on the N-type semiconductor substrate.

10. The semiconductor device according to claim 1, wherein the first, second, fifth and sixth resistor elements have higher resistance values than the third, fourth, seventh and eighth resistor elements, respectively.

11. The semiconductor device according to claim 1, wherein the first and second resistor elements have substantially equal resistance values, the third and fourth resistor elements have substantially equal resistance values, the fifth and sixth resistor elements have substantially equal resistance values, and the seventh and eighth resistor elements have substantially equal resistance values.

12. The semiconductor device according to claim 11, wherein the first to eighth resistor elements are formed of diffusion layers which are formed by diffusing impurities of a second conductivity type in a semiconductor substrate of a first conductivity type, the diffusion layers of the first and second resistor elements have substantially equal areas, the diffusion layers of the third and fourth resistor elements have substantially equal areas, the diffusion layers of the fifth and sixth resistor elements have substantially equal areas, and the diffusion layers of the seventh and eighth resistor elements have substantially equal areas.

13. The semiconductor device according to claim 4, wherein the third and fourth resistor elements and the seventh and eighth resistor elements are connected between the output terminal and the reference potential terminal via switches that are turned on in the active mode, and the switches are formed of NMOS transistors formed in the P-type semiconductor substrate.

14. The semiconductor device according to claim 4, wherein the third and fourth resistor elements and the seventh and eighth resistor elements are connected between the output terminal and the reference potential terminal via switches that are turned on in the active mode, and the switches are formed of PMOS transistors formed in the N-type semiconductor substrate.

15. The semiconductor device according to claim 4, wherein the third and fourth resistor elements and the seventh and eighth resistor elements are connected between the output terminal and the reference potential terminal via switches that are turned on in the active mode, and each of the switches includes an NMOS transistor and a PMOS transistor connected in parallel and formed on the semiconductor substrate.

\* \* \* \* \*